United States Patent [19]

Anderson et al.

[11] Patent Number: 5,751,009
[45] Date of Patent: May 12, 1998

[54] OPTICAL ISOLATOR HAVING LEADFRAME WITH NON-PLANAR MOUNTING PORTIONS

[75] Inventors: Samuel J. Anderson, Tempe, Ariz.; Austin V. Harton, Oak Park; Jang-Hun Yeh, Streamwood, both of Ill.; John Bliss, Tempe, Ariz.; Karl W. Wyatt, Cary, Ill.

[73] Assignee: Motorola, Inc., Schaumburg, Ill.

[21] Appl. No.: 637,516

[22] Filed: Apr. 25, 1996

[51] Int. Cl.$^6$ .................................. G02B 27/00
[52] U.S. Cl. ...................... 250/551; 250/239; 257/81
[58] Field of Search ........................ 250/551, 239, 250/214 R, 214.1, 216; 257/80–82, 99, 666, 433, 446

[56] References Cited

U.S. PATENT DOCUMENTS

| | | |
|---|---|---|
| 4,322,628 | 3/1982 | Tanaka .................................. 250/551 |
| 4,711,997 | 12/1987 | Miller ................................... 250/216 |
| 4,980,568 | 12/1990 | Merrick et al. ........................... 257/81 |
| 5,237,434 | 8/1993 | Feldman et al. ......................... 359/19 |
| 5,340,993 | 8/1994 | Salina et al. ........................... 250/551 |
| 5,500,912 | 3/1996 | Alonas et al. ........................... 385/37 |

*Primary Examiner*—Que Le
*Attorney, Agent, or Firm*—George C. Chen

[57] ABSTRACT

An optical isolator (10) includes an opto-electronic emitter (16) and an opto-electronic detector (17) mounted over offset portions (12, 13) of a leadframe (11). The offset portions (12, 13) form angles (14, 15) with other portions (24, 25) of the leadframe (11). An optically transmissive material (22) encapsulates the opto-electronic emitter (16) and the opto-electronic detector (17), and a reflective material (20) is located above the opto-electronic emitter (16) and the opto-electronic detector (17). An optically insulative packaging material (26) encapsulates the optically transmissive material (22).

20 Claims, 1 Drawing Sheet

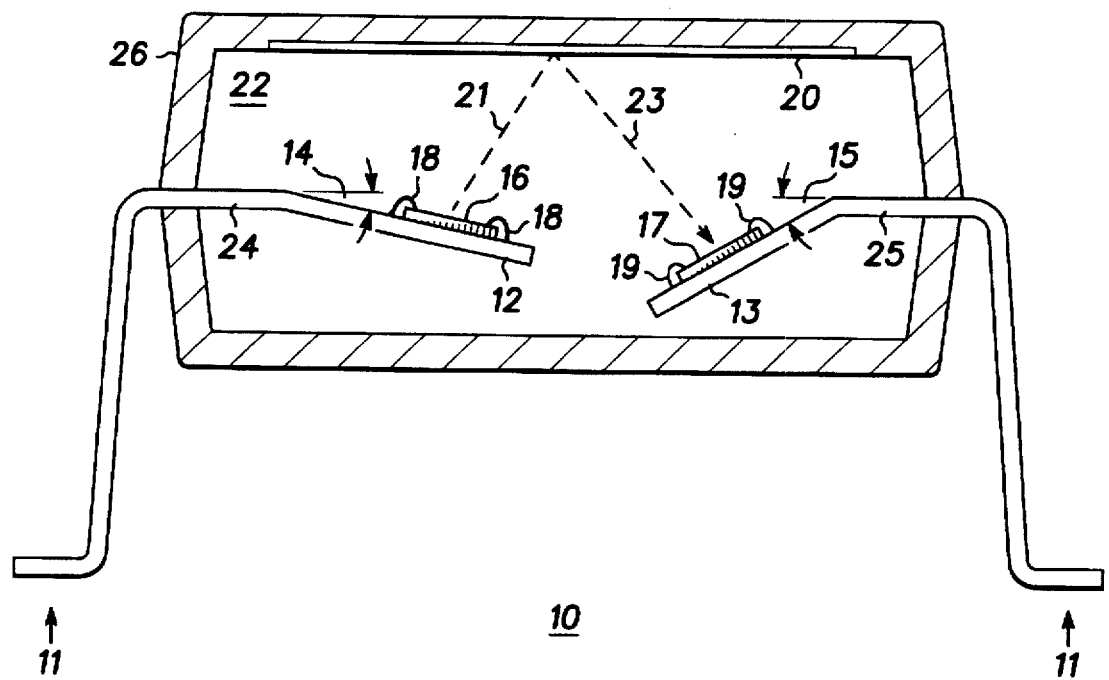

OPTICAL ISOLATOR HAVING LEADFRAME WITH NON-PLANAR MOUNTING PORTIONS

BACKGROUND OF THE INVENTION

This invention relates, in general, to optical devices, and more particularly, to optical coupling of opto-electronic components.

Optical isolators provide electrical isolation between different portions of an electronic circuit. The electrical isolation provides high voltage protection for the electronic circuit and also reduces the level of noise in the electronic circuit.

As an example of a conventional optical isolator, a light emitting diode (LED) is mounted over and transmits light directly toward an underlying light detector. However, to accomplish this direct transmission of light, the LED and the light detector must be precisely aligned, which is a difficult and expensive manufacturing procedure. Furthermore, the overlapping positions of the LED and the light detector produce an internal parasitic capacitance, which generates parasitic displacement currents during fast transient operation. As a result of the parasitic displacement currents, the noise level of this conventional optical isolator is increased, which degrades its performance.

In a second example of a conventional optical isolator, a LED and a light detector are mounted on electrically separated halves of a leadframe so that the LED and the light detector are in a common plane. An optically transparent material surrounds the LED and the light detector, and an optically reflective material surrounds the optically transparent material. Light from the LED is conducted through the optically transparent material and is reflected off of the optically reflective material. The light is conducted and reflected several times before being detected by the light detector. Consequently, the intensity of the light from the LED is greatly diminished prior to being detected by the light detector. Thus, the light transfer efficiency from the LED to the light detector is degraded to less than twenty percent.

Accordingly, a need exists for an optical isolator that provides electrical isolation between different portions of an electronic circuit. The optical isolator should be cost-effective, should not require complicated alignment procedures during its manufacture, should not have high noise levels during operation, and should have a high light transfer efficiency.

BRIEF DESCRIPTION OF THE DRAWING

The single FIGURE illustrates a cross-sectional view of an optical isolator in accordance with the present invention.

DETAILED DESCRIPTION OF THE DRAWING

Turning to the single FIGURE for a more detailed description, a semiconductor component or optical isolator 10 includes a leadframe 11, which is comprised of conventional semiconductor leadframe materials. Leadframe 11 has planar portions 24 and 25 and also has non-planar portions 12 and 13, which are electrically isolated or insulated from each other. As illustrated in the single FIGURE, portions 12 and 13 are non-planar, uneven, or offset from each other and from portions 24 and 25, respectively.

As an example, portions 12 and 24 of leadframe 11 can be formed from one sheet of electrically conductive material while portions 13 and 25 of leadframe 11 are formed from a different sheet of electrically conductive material. However, portions 12, 13, 24, and 25 are preferably part of a common leadframe formed from a common sheet of electrically conductive material to simplify the assembly of optical isolator 10. Using a common sheet of material, portions 12 and 13 can be electrically isolated from each other by, for example, trimming away interconnect rails, dam bars, and cross bars after an encapsulation process described hereinafter.

Leadframe 11 has angles 14 and 15. Angle 14 is formed by portions 12 and 24, and angle 15 is formed by portions 13 and 25. Angles 14 and 15 can be created by using a stamping tool, as known in the art, to bend portions 12 and 13 of leadframe 11. Angles 14 and 15 can be equal or unequal as explained hereinafter.

Optical isolator 10 also includes an optical transmitter or emitter 16 coupled to portion 12 of leadframe 11 and an optical receiver or detector 17 coupled to portion 13 of leadframe 11. Emitter 16 is an opto-electronic device that converts an electrical signal into an optical signal. Similar to emitter 16, detector 17 is also an opto-electronic device, but detector 17 converts an optical signal into an electrical signal.

Emitter 16 and detector 17 are fabricated using manufacturing processes known in the art and are disposed or mounted over portions 12 and 13, respectively, of leadframe 11 using optical assembly equipment and processes known in the art. Portions 12 and 13 can be larger than the illustrated emitter 16 and detector 17, respectively, so that leadframe 11 can be used with different sized embodiments of emitter 16 and detector 17 in order to increase the design flexibility of leadframe 11 and optical isolator 10.

Examples of emitter 16 include, but are not limited to, light emitting semiconductor devices such as, for example, light emitting diodes (LEDs) and semiconductor laser diodes. Examples of detector 17 include, but are not limited to, semiconductor photo-diodes or photo-transistors such as, for example, a photosensitive insulated gate bipolar transistor (IGBT) or a photosensitive metal-oxide-semiconductor field effect transistor (MOSFET). To improve the current handling performance of optical isolator 10, detector 17 is preferably an IGBT.

The distance between emitter 16 and detector 17 and the distance between the distal ends of portions 12 and 13 should be small to conserve space but should also be large enough to meet the specific voltage isolation requirements for the desired application of optical isolator 10. As an example, emitter 16 and detector 17 can be separated by a distance of less than approximately five millimeters.

Wire bonds 18 and 19 electrically couple emitter 16 and detector 17, respectively, to different portions of leadframe 11. It is understood that other interconnect techniques can be used to provide electrical coupling to emitter 16 and detector 17. For example, a tape automated bonding (TAB) or a flip chip method can also be used.

An optically transmissive material 22 encapsulates emitter 16, detector 17, wire bonds 18 and 19, portions 12 and 13 of leadframe 11, and portions of portions 24 and 25 of leadframe 11. Optically transmissive material 22 should be electrically insulating in order to electrically isolate emitter 16 and detector 17. Optically transmissive material 22 should also be optically transparent to optically couple emitter 16 and detector 17. Optically transmissive material 22 is preferably comprised of a material that does not absorb significant amounts of light in order to improve the light transfer efficiency from emitter 16 to detector 17 to greater than approximately twenty-five percent. Optically transmissive material 22 should also be sufficiently rigid to protect wire bonds 18 and 19 from physical damage and to hold optical isolator 10 together.

Optically transmissive material 22 can be comprised of an optically transparent material such as plastic or glass, which is molded around emitter 16, detector 17, and portions 12 and 13 of leadframe 11. As an example, a material identified as NT-8500P, which is commercially available from Nitto Denko America, Incorporated of San Jose, Calif., can be used for optically transmissive material 22.

A reflective material 20 is located above or overlies emitter 16 and detector 17. Reflective material 20 is optically coupled to optically transmissive material 22 by an optically transmissive adhesive. Reflective material 20 assists in optically coupling emitter 16 and detector 17 by reflecting an incident light beam 21 from emitter 16 to detector 17, wherein the reflected light beam is identified in the single FIGURE as light beam 23. As an example, reflective material 20 can be comprised of a mirror or a reflective holographic element.

If a mirror is used for reflective material 20, the angle of incidence of light beam 21 equals the angle of reflection of light beam 23, wherein the angles of incidence and reflection are measured from an axis perpendicular to the reflection surface of reflective material 20. In this example, one skilled in the art will understand that if angles 14 and 15 of leadframe 11 are decreased, then the angles of incidence and reflection at reflective material 20 will also be decreased. Consequently, the size of optical isolator 10 must be increased because the distance between reflective material 20 and emitter 16, the distance between reflective material 20 and detector 17, or the distance between emitter 16 and detector 17 must be increased to ensure proper optical coupling between emitter 16 and detector 17. However, a larger sized optical isolator provides an inefficient use of space.

Similarly, one skilled in the art will also understand that if the distance between reflective material 20 and emitter 16, the distance between reflective material 20 and detector 17, or the distance between emitter 16 and detector 17 is decreased, then angles 14 and 15 of leadframe 11 must be increased to ensure proper optical coupling between emitter 16 and detector 17. However, increasing angles 14 and 15 can also increase the size of optical isolator 10, which is undesirable for reasons discussed earlier.

However, if a reflective holographic element is used for reflective material 20, the angles of incidence and reflection for reflective material 20 do not have to be equal. Therefore, a holographic element is preferred for reflective material 20 because the size of optical isolator 10 can remain small while angles 14 and 15 remain small and while the distance between reflective material 20, emitter 16, and detector 17 also remain small.

To fabricate a holographic element for reflective material 20, a photo-sensitive film emulsion can be exposed to laser recording processes known in the art in order to tune or adjust the photo-sensitive film to have a desired angle of reflection. Examples of commercially available photo-sensitive films include, but are not limited to, dichomated gelatin, silver halides, or photopolymers. Reflective material 20 can be coupled to optically transmissive material 22 before or after the laser recording process.

To minimize the cost of the materials used to fabricate optical isolator 10, reflective material 20 should be as small as the cross section of incident light beam 21. However, a smaller size for reflective material 20 increases the assembly cost for optical isolator 10 because of the increased precision necessary to align reflective material 20, emitter 16, and detector 17. Therefore, to reduce the overall cost of optical isolator 10, reflective material 20 should be large enough to overlie portions 12 and 13 of leadframe 11, as portrayed in the single FIGURE. In this manner, the cost for reflective material 20 is optimized with the assembly cost for optical isolator 10.

Furthermore, when reflective material 20 is a holographic element, angles 14 and 15 can be less than approximately thirty-five degrees in order to keep optical isolator 10 small. Moreover, angle 14 can be smaller than angle 15 to reduce the manufacturing cost of optical isolator 10. With a smaller angle 14 and a larger angle 15, detector 17 is further away from reflective material 20, and the cross-section of reflected light beam 23 is larger at detector 17. With a larger light beam cross-section, the precision necessary to align emitter 16 is reduced, which lowers the cost of fabricating optical isolator 10. However, a larger light beam cross-section can also reduce the light transfer efficiency of optical isolator 10 because a smaller fraction of reflected light beam 23 may be detected by detector 17. Therefore, angles 14 and 15 should be optimized for the manufacturing simplicity, the manufacturing cost, the light transfer efficiency, and the size of optical isolator 10.

To prevent exterior or environmental light from reaching detector 17 and interfering with the light generated by emitter 16, an optically insulative packaging material 26 is molded to encapsulate optically transmissive material 22, reflective material 20, emitter 16, detector 17, and portions 12 and 13 of leadframe 11. Packaging material 26 also should keep light generated by emitter 16 within optically transmissive material 22 and should also be substantially rigid to further improve the structural integrity of optical isolator 10. When reflective material 20 is a reflective hologram, the reflective properties of reflective material 20 are improved when optically insulative packaging material 26 encapsulates reflective material 20 and optically transmissive material 22. As an example, HYSOL™ MG40F which is commercially available from Dexter Corporation of Olean, N.Y., can be used for packaging material 26.

Therefore, in accordance with the present invention, it is apparent there has been provided an improved optical isolator that overcomes the disadvantages of the prior art. The large internal parasitic capacitances that create noise problems in the prior art are minimized because the emitter is not positioned over the detector. Furthermore, the light transfer efficiency from the emitter to the detector is improved because light from the emitter is reflected only once before being sensed by the detector. Additionally, the manufacturing of an optical isolator is simplified and is less expensive because a single reflective element is used and because the precision required for aligning the reflective element to the emitter and the detector is reduced. Moreover, the overall size of an optical isolator is kept small.

While the invention has been particularly shown and described with reference to preferred embodiments, it will be understood by those skilled in the art that changes in form and detail may be made without departing from the spirit and scope of the invention. For instance, although the single FIGURE depicts a single detector 17 optically coupled to a single emitter 16, it is understood that a plurality of detectors can be coupled to a single emitter. In this alternative embodiment, reflective material 20 can be a holographic element that has a plurality of reflection angles. As an additional example, optical isolator 10 can be a flip chip device, a ball grid array device, or the like. Accordingly, the disclosure of the present invention is not intended to be limiting. Instead, the disclosure of the present invention is intended to be illustrative of the scope of the invention, which is set forth in the following claims.

We claim:

1. An optical isolator comprising:

a leadframe having a first portion and a second portion, wherein the first and second portions are uneven and are electrically isolated from each other;

an optical detector disposed over the first portion of the leadframe;

an optical emitter disposed over the second portion of the leadframe;

a holographic element located above the optical detector and the optical emitter; and an optically transmissive material encapsulating the first portion of the leadframe, the second portion of the leadframe, the optical detector, and the optical emitter.

2. The optical isolator according to claim 1 wherein the leadframe includes a third portion, the first and second portions uneven with the third portion.

3. The optical isolator according to claim 2 wherein the optically transmissive material encapsulates a portion of the third portion of the leadframe.

4. The optical isolator according to claim 2 wherein the first and third portions form a first angle and wherein the second and third portions form a second angle, the first and second angles less than approximately thirty-five degrees.

5. The optical isolator according to claim 4 wherein the first angle is different from the second angle.

6. The optical isolator according to claim 1 wherein the optical detector is electrically coupled to the first portion of the leadframe and wherein the optical emitter is electrically coupled to the second portion of the leadframe.

7. The optical isolator according to claim 1 wherein the holographic element overlies all of the first and second portions of the leadframe.

8. The optical isolator according to claim 1 wherein the optically transmissive material optically couples the holographic element to the optical detector and the optical emitter.

9. The optical isolator according to claim 1 further comprising an optically insulative material encapsulating the optically transmissive material.

10. A semiconductor component comprising:

a leadframe having a first portion offset from a second portion, the first portion electrically insulated from the second portion;

an optical transmitter coupled to the first portion of the leadframe;

an optical receiver coupled to the second portion of the leadframe; and a reflective material above the optical transmitter and completely covering the first and second portions of the leadframe.

11. The semiconductor component according to claim 10 wherein the leadframe includes a third portion, the first and second portions offset from the third portion.

12. The semiconductor component according to claim 10 wherein the optical receiver is a photosensitive insulated gate bipolar transistor.

13. The semiconductor component according to claim 10 wherein the leadframe includes a third portion, the first portion of the leadframe forming a first angle with the third portion, the second portion of the leadframe forming a second angle with the third portion, the first angle different from the second angle, and the first and second angles less than approximately thirty-five degrees.

14. The semiconductor component according to claim 13 further comprising an optically transparent material coupling the optical transmitter, the optical receiver, and the reflective material wherein the optically transparent material encapsulates the first and second portions of the leadframe.

15. A semiconductor component comprising:

a leadframe having a first portion, a second portion, and a third portion, the first portion electrically isolated from the second portion, the first portion and the second portion non-planar with the third portion and non-planar with each other, the first portion forming an angle with the third portion, the second portion forming a different angle with the third portion;

an opto-electronic emitter mounted over the first portion of the leadframe;

an opto-electronic detector mounted over the second portion of the leadframe;

a holographic element above the opto-electronic emitter and the opto-electronic detector;

an optically transmissive material coupled to the holographic element and encapsulating the opto-electronic emitter and the opto-electronic detector; and an optically insulative packaging material encapsulating the optically transmissive material.

16. The semiconductor component according to claim 15 wherein the angle and the different angle are each less than approximately thirty-five degrees.

17. The semiconductor component according to claim 16 wherein the angle is smaller than the different angle.

18. The semiconductor component according to claim 15 wherein the opto-electronic detector is a photo-transistor.

19. The semiconductor component according to claim 18 wherein the photo-transistor is an insulated gate bipolar transistor or a metal-oxide-semiconductor field effect transistor.

20. The semiconductor component according to claim 15 wherein the optically transmissive material encapsulates the first and second portions of the leadframe and wherein the holographic element overlies all of the first and second portions of the leadframe.

* * * * *